(12) United States Patent
Lang

(10) Patent No.: US 7,015,704 B1
(45) Date of Patent: Mar. 21, 2006

(54) CAPACITIVE SENSOR DEVICE AND INSTALLATIONS COMPRISING A SENSOR DEVICE THIS TYPE

(76) Inventor: Edo Lang, Churweg 5, CH-7203 Trimmis (CH)

( * ) Notice: Subject to any disclaimer, the term of this patent is extended or adjusted under 35 U.S.C. 154(b) by 0 days.

(21) Appl. No.: 10/523,089

(22) PCT Filed: Jul. 21, 2003

(86) PCT No.: PCT/CH03/00487

§ 371 (c)(1),
(2), (4) Date: Feb. 2, 2005

(87) PCT Pub. No.: WO2004/013966

PCT Pub. Date: Dec. 3, 2004

(30) Foreign Application Priority Data

Aug. 2, 2002 (CH) .................................. 1353/02

(51) Int. Cl.
*G01R 27/26* (2006.01)

(52) U.S. Cl. ........................................ 324/661; 324/686

(58) Field of Classification Search ............... None
See application file for complete search history.

(56) References Cited

U.S. PATENT DOCUMENTS

| 5,594,353 | A  | * | 1/1997 | Hemphill | .................... | 324/681 |
| 6,559,658 | B1 | * | 5/2003 | Brandt | ........................ | 324/681 |

* cited by examiner

*Primary Examiner*—Vincent Q. Nguyen
(74) *Attorney, Agent, or Firm*—Notaro & Michalos PC

(57) ABSTRACT

A water supply for sanitary devices has a sensor, is activatable without contact, has a first capacitor with first and second conductive layers and a dielectric layer positioned there-between. A second capacitor having a first and second electrically conductive layers and a dielectric layer there-between. An AC voltage generator is electrically connected to the second layer of the first capacitor for coupling an AC voltage. The supply has a sensor amplifier for amplifying an output signal and the first layer is shared by the capacitors and has a shared absorption area. Upon approach or contact of an object or a liquid, an additional capacitor is formed whose effective capacitance experiences a detectable change that is tapped at the second layer.

14 Claims, 9 Drawing Sheets

CAPACITIVE SENSOR DEVICE AND INSTALLATIONS COMPRISING A SENSOR DEVICE THIS TYPE

The present patent application claims the priority of Swiss Patent Application CH 2002 1353/02, which was filed on Aug. 2, 2002.

The present invention relates to capacitive sensors and sensor devices which are particularly usable for detecting motions or objects. It especially relates to capacitive sensors and sensor devices which have an AC voltage signal applied to them and whose output signal is analyzed via an amplifier stage.

BACKGROUND INFORMATION

There are essentially three different types of capacitive sensors. The first variation is distinguished in that the capacitance C having its sensor area is the frequency-determining element in an oscillator. A frequency shift, an amplitude change, or a damping increase is analyzed via a corresponding method. The disadvantage of this method is a very narrowly limited active region. A further disadvantage is their susceptibility to breakdown due to the influence of contamination and/or moisture.

A second type of capacitive sensor is based on a repeating charge reversal of a defined DC voltage potential, in whose capacitance-time conversion the charge reversal duration is analyzed. A disadvantage of this variation is a very narrowly limited response region. Furthermore, this principle has no static detection interval, but rather a dynamic detection interval which is a function of the approach speed and the approach angle of an object. An example of a sensor which is based on the charge reversal principle is described in a publication of EDISEN-electronic GmbH from 2001. This publication has the title "Schalten wie von Geisterhand—in der Zeitebene liegt der Zauber [Switching as if by magic—the magic is in the time plane]". The analysis method described in this publication is the object of a European Patent Application which was published under the number EP 0 723 339 A1. A comparable approach, which is based on the charge reversal principle, is described in German Published Application DE 25 16 024. There is a German Published Application DE 198 15 324 A1, in which a sanitary valve is described that is designed so that through repeated charge reversal and determination of the charge reversal duration, the water supply may be controlled.

A third type is capacitive barriers, whose geometric positioning of the two plates corresponds to an optical light barrier and which exploit the fact that a current flows between two capacitor plates when they are powered with AC voltage. One possibility is to shield both plates from one another through a conductive and grounded object. In this case, the capacitive current becomes smaller or disappears entirely. In addition, the capacitance may be elevated if a non-grounded object is pushed between the two plates. In this case, the capacitive current becomes larger. The disadvantage of this variation is that the object must be located between the plates. A further disadvantage is the increasing susceptibility to breakdown due to external influences with increasing plate spacing. The dependence of the AC voltage amplitude on the plate spacing is also a disadvantage. A capacitive sensor for detecting the fill level of a liquid is described in German Published Application DE 199 49 985.

A further arrangement for use in the sanitary field is described in U.S. Pat. No. 5,694,653. The arrangement described allows contact-less controlling of the water supply and the temperature of the water in a washbasin. The valve is wired so that it acts as a transmitter which emits electrostatic waves. If a user moves his hand toward the valve, the hand acts as a receiver of the electrostatic radiation. A large-area receiver is positioned in the front region of the washbasin, which in turn absorbs the electrostatic radiation emitted from the body of the user. A transmission circuit is thus closed and it may be detected that the hand has approached the valve. This type of arrangement is very sensitive and has a very complex construction.

OBJECT OF THE INVENTION

The present invention is therefore based on the object of providing a sensor device, which both reduces or eliminates the disadvantages described in the related art and also has further advantages. The present invention offers, among other things, the following advantages: larger response and active regions, strongly improved signal-to-noise ratio, detection of static and moving objects and their position in the active region, independence from generator voltage amplitude in the function of the active region, and, since a non-grounded object does not influence the sensor unit, also a simple, unremarkable adaptation to existing objects.

ACHIEVEMENT OF THE OBJECT

This object is achieved
for the sensor device by the features of claim 1; and
for installations by the features of claim 16.
Advantageous refinements of the present invention are defined by the dependent claims.

In the following, the present invention will be described in greater detail with reference to the drawing.

Figure 1A:
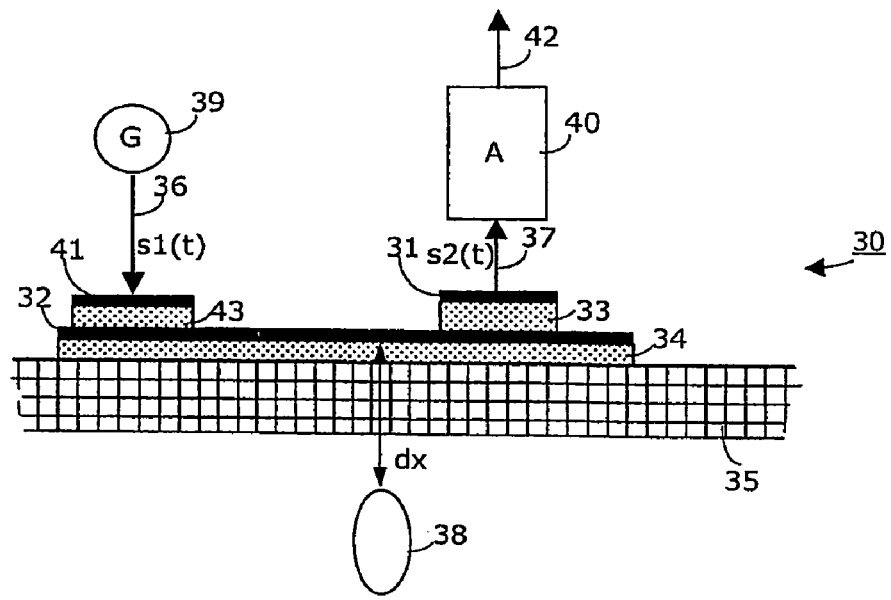
FIG. 1A shows a first sensor device according to the present invention in a schematic sectional illustration.

The schematic construction of the present invention is shown in FIG. 1A. A second electrically conductive area 41 is attached to a first electrically conductive area 32 using the insulator 43. Furthermore, a third electrically conductive area 31 is provided on the first conductive area 32 using a second insulator 33. The electrically conductive area 41 is connected via a connection 36 to an AC voltage generator 39. The electrically conductive area 31 is connected via a connection 37 to a sensor amplifier 40.

Figure 1B:
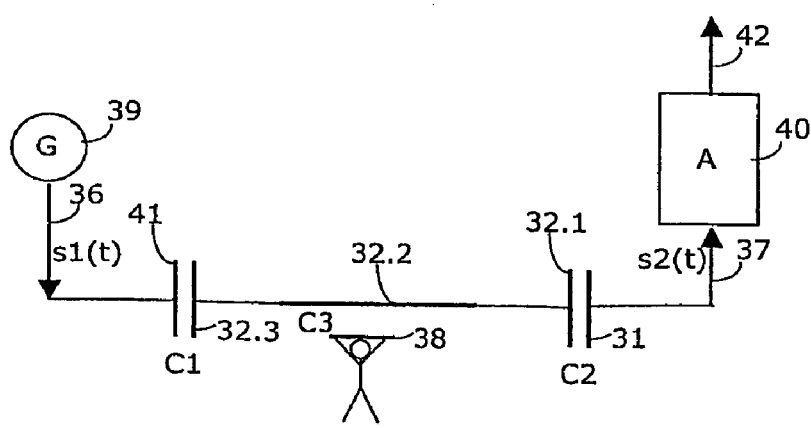
FIG. 1B shows an equivalent circuit diagram of the sensor device shown in FIG. 1A.

The functional principle according to the present invention will be explained in detail in connection with FIG. 1B: a generator signal $s1(t)$ is coupled through the AC voltage generator 39 via C1, comprising a first electrically conductive area 41, the dielectric 43, and a second electrically conductive area 32.3. The signal $s2(t)$ is coupled out via C2, comprising a first electrically conductive area 31, the dielectric 33, and a second electrically conductive area 32.1, onto the sensor amplifier 40. The partial areas 32.1, 32.2, and 32.3 correspond in the arrangement described to the area 32 shown in FIG. 1A. A capacitance C3 comprises the first area 32.2 and the dielectric in the range dx, which, in addition to $\epsilon_0$ (for the air gap), may be composed from different $\epsilon_r$, as is shown, for example, in FIG. 1A using an adhesive layer 34 and a carrier material 35, and the object 38. C3 changes its capacitance as a function of dx, as a function of the construction of the dielectric, and also as a function of the object 38. In the extreme case, if there is no $\epsilon_r$ and there is direct contact of the object 38 with the absorption area 32, C3 is replaced by a resistance $R \leq 0$.

The arrangement between the coupling point 36 for $s1(t)$ and the point 37 at which $s2(t)$ is tapped forms the actual electrical network of the sensor device, C1 and C3 forming a voltage divider, whose central tap supplies the signal $s2(t)$ to the sensor amplifier 40 via C2. If the object 38 approaches the area 32, dx is reduced and the effective capacitance of C3 is thus elevated. The signal $s2(t)$ is thus correspondingly damped. If the object 38 moves away from the area 32, dx becomes larger and the capacitance of C3 thus becomes smaller. Accordingly, $s2(t)$ is damped less. Thus, the area 32 can be regarded as absorption area. The dimension of the absorption area 32 is a function of the application. The ratio of the dimensions of the electrically conductive areas 31, 32, and 41 and their dielectrics 33 and 43 to one another are also a function of the application. The operating region of the sensor device may be optimized using voltage adaptation. This requires a corresponding dimensioning of C1 in relation to C3. The active region of the sensor unit is essentially determined by its absorption area 32.

Figure 3A:
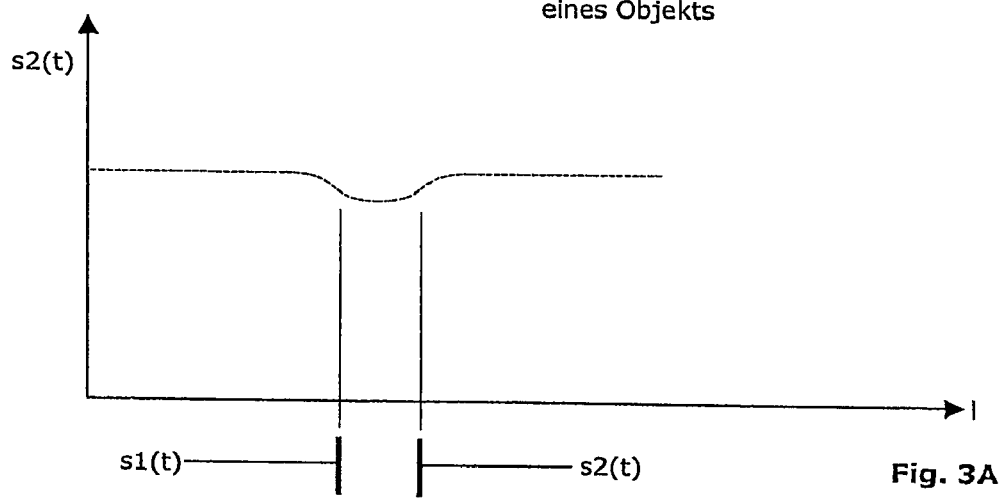
FIG. 3A shows a schematic illustration which displays the active region of a conventional sensor.
Figure 3B:
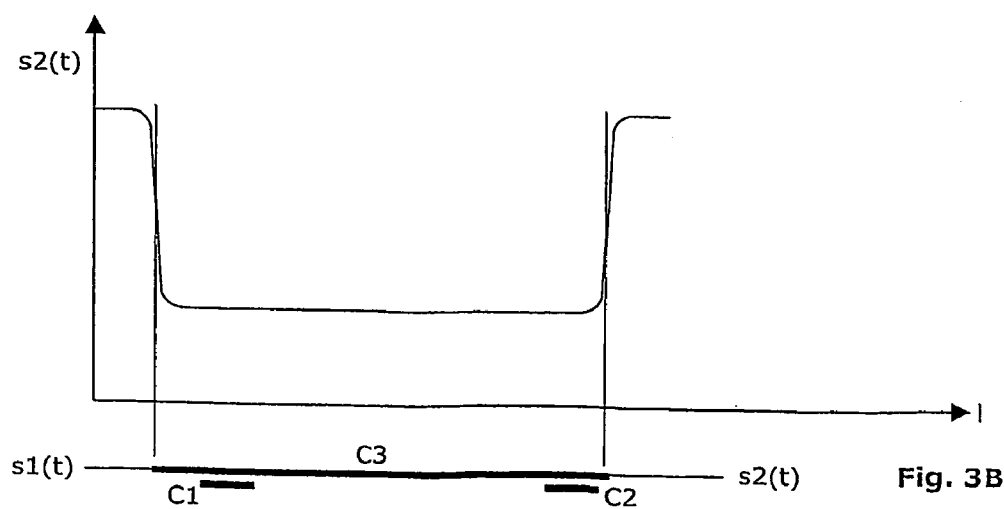
FIG. 3B shows a schematic illustration which displays the active region of a sensor device according to the present invention.

The response region of a conventional sensor device is compared with the sensor device according to the present invention in FIGS. 3A and 3B. The conventional sensor device is shown below the diagram in FIG. 3A. The signal $s2(t)$ is only attenuated when an object approaches the plates of the capacitor in a very narrowly limited region.

In the sensor device according to the present invention, which is shown below the diagram in FIG. 3B, the desired response region is set using the dimension of the absorption area and/or fixed thereby.

In order that the electrical field of C1 and C2 may not be influenced, or in the extreme case even short-circuited, both the electrically conductive areas 31 and 41 and also their dielectrics 33 and 43 are to be positioned behind the absorption area 32 and/or invisibly to the object 38, as is shown in FIG. 1A. A direct comparison of a conventional capacitive sensor device and the sensor device according to the present invention are shown in this regard in FIG. 2. The behavior when the sensor unit is moistened is shown. The output voltage $s2(t)$ of a conventional sensor unit is constant (curve 220) in the dry state. As soon as moisture wets the sensor device, a short-circuit occurs and the output voltage jumps suddenly and achieves a maximum voltage smax.

In contrast, the sensor device according to the present invention is insensitive to moisture. A short-circuit may not occur. The curve 221 runs horizontally. If an object now approaches, the voltage $s2(t)$ falls, since damping occurs due to C3. The conventional sensor device shows no reaction when the object approaches because of the short-circuit.

Figure 4A:
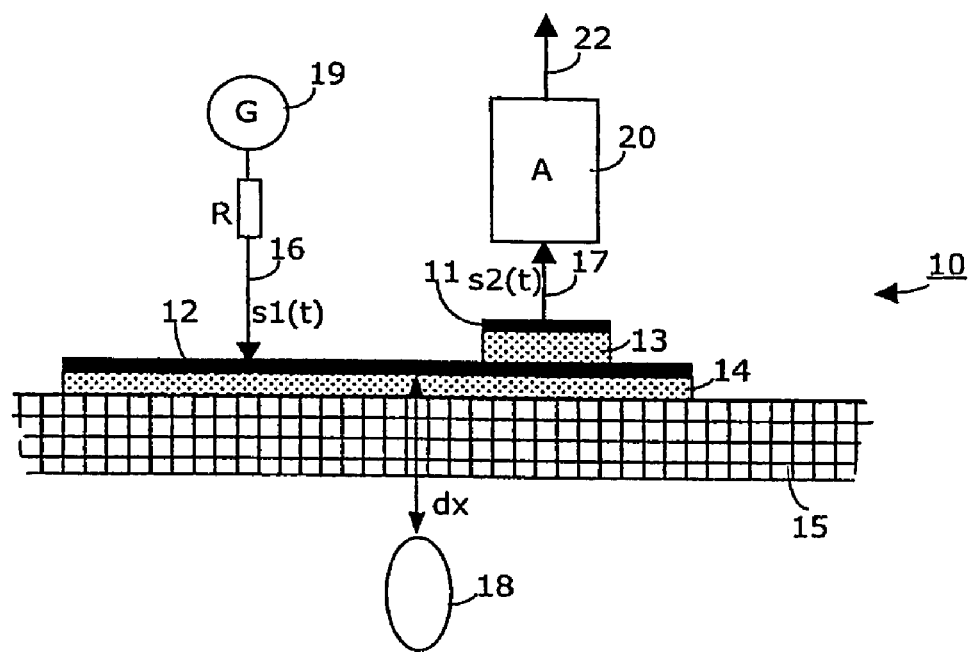
FIG. 4A shows a second sensor device according to the present invention in a schematic sectional illustration.
Figure 4B:
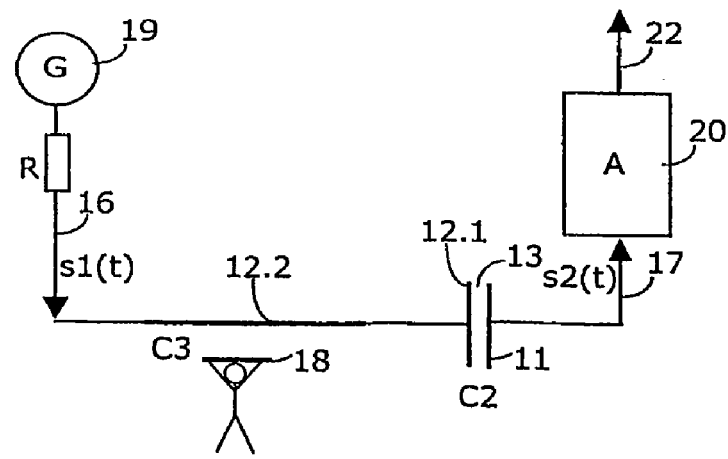
FIG. 4B shows an equivalent circuit diagram of the sensor device shown in FIG. 2A.

In the following, further embodiments of the present invention will be described:

A further embodiment of the present invention is shown in FIG. 4A. A comparison of FIG. 1A with FIG. 4A shows that C1 was replaced by a resistor R. The functional principle according to the present invention will be explained in detail with reference to FIG. 4B. The generator signal $s1(t)$ is coupled in by an AC voltage generator 19 via the resistor R. The resistor R may, for example, be the output resistance of the generator 19. The signal $s2(t)$ is coupled out via C2, comprising a first electrically conductive area 12, the dielectric 13, and a second electrically conductive area 11, on a sensor amplifier 20. The partial areas 12.1 and 12.2 in the arrangement shown correspond to the area 12 shown in FIG. 4A. The capacitance C3 comprises a first area 12 and a dielectric in the range dx, which, in addition to $\epsilon_0$ (for the air gap), may be composed from different $\epsilon_r$, as is shown, for example, in FIG. 4A using an adhesive layer 14 and a carrier material 15, and the object 18. C3 changes its capacitance as a function of dx, as a function of the construction of the dielectric, and also as a function of the object 18. In the extreme case, if there is no $\epsilon_r$ and there is direct contact of the object 18 with the absorption area 12, C3 is replaced by a resistance $R \geq 0$.

The arrangement between the coupling point 16 for $s1(t)$ and the point 17 at which $s2(t)$ is tapped forms the actual electrical network of the sensor device, R and C3 forming a voltage divider, whose central tap supplies the signal $s2(t)$ to the sensor amplifier 20 via C2. If the object 38 approaches the area 12, dx is reduced and the capacitance of C3 is thus elevated. The signal $s2(t)$ is correspondingly damped. If the object 18 moves away from the area 12, dx becomes larger and the capacitance of C3 thus becomes smaller. Accordingly, $s2(t)$ is damped less. The area 12 is thus referred to as the absorption area. The dimension of the absorption area 12 is a function of the application. The ratio of R to C3 is also a function of the application. The operating region may be optimized using voltage adaptation. This requires a corresponding dimensioning of R in relation to C3. The active region of the sensor unit is essentially determined by the size and shape of the absorption area 12.

In order that the electrical field of C2 may not be influenced, or in the extreme case even short-circuited, the electrically conductive area 11 and also its dielectric 13 are to be positioned behind the absorption area 12 and/or invisibly to the object 18, as shown in FIG. 4A. In this regard, the resistor R is also to be attached behind the absorption area 12. However, this construction has the disadvantage that in contrast to the embodiment in FIG. 1A, there is no longer an electrical separation between the generator 19 and the absorption area 12.

A further embodiment 30 is that in the variation shown in FIG. 1A, the capacitor C2 is replaced by a high-ohmic resistor. This embodiment is not shown. The disadvantage of this construction variation is that the sensor amplifier is electrically connected to the absorption area.

Figure 5:
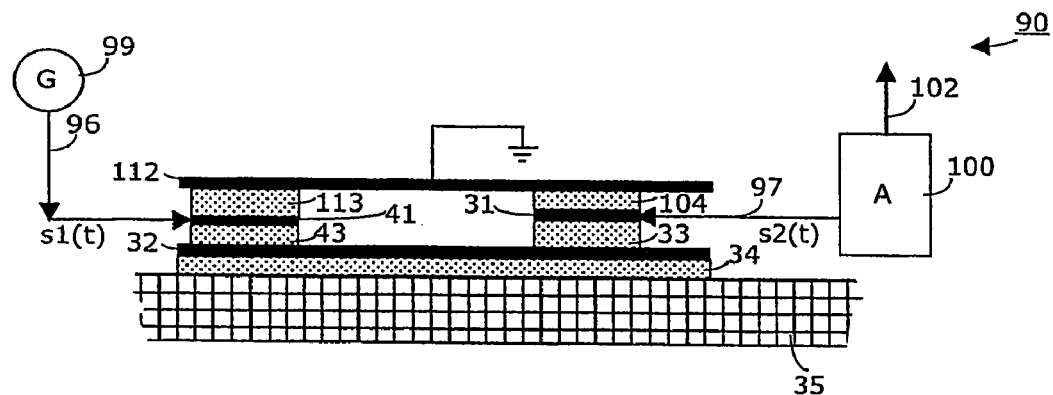
FIG. 5 shows a further sensor device according to the present invention, which has a similarity to the sensor device shown in FIGS. 1A and 1B, in a top view.

A further embodiment of the present invention is shown in FIG. 5. The embodiment 90 shown in FIG. 5 corresponds in some elements to those of the embodiment 30. For the sake of simplicity, these elements are identified using identical reference numbers as in FIGS. 1A and 1B. The sensor device 9 is distinguished in that a shielding area 112 is provided. This shielding area 112 comprises a conductive material and is preferably applied to either ground or mass. The shielding area 112 is decoupled from the areas 31 and 41 of the capacitors C1 and C2 by two dielectric layers 104 and 113. Through the shielding area 112, the response region of the sensor device 90 may be fixed primarily on the semi-space in front of the absorption area 32. Movements behind the sensor device 90 (in FIG. 5 above the shielding area 112) are not detected. Interfering influences may thus be excluded or reduced. Simultaneously, the shielding area 112 acts as a shield against electromagnetic interference. The signal-to-noise ratio may thus be improved. According to the present invention, an AC voltage signal s1($t$) from an AC voltage generator 99 is coupled via a conductive connection 96 into the area 41 of the capacitor C1. On the output side, a sensor amplifier 100 is connected via a conductive connection 97 to a plate 31 of the capacitor C2. A signal s2($t$) is coupled out of the capacitor network here.

Figure 6:
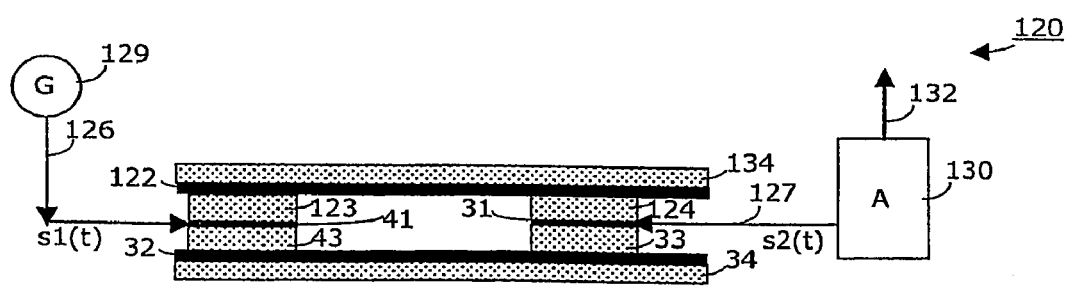
FIG. 6 shows a further sensor device according to the present invention in a sectional illustration.

A further embodiment 120 is shown in FIG. 6. The embodiment 120 shown in FIG. 6 corresponds in some elements to the embodiments 30 and/or 90. For the sake of simplicity, these elements are identified using the identical reference numbers as in FIG. 1 and/or FIG. 5. The sensor device 120 is distinguished in that it has a symmetrical response region. The response region extends into the semi-space above and the semi-space below the sensor device 120 shown. The entire construction is mirror-symmetrical to a central plane (not shown) in this example. In addition to the capacitance C1, formed by the first absorption area 32, the dielectric 43, and the area 41, and the capacitance C2, formed by the first absorption area 32, the dielectric 33, and the area 31, the sensor device 120 comprises two further capacitors C1' and C2', as well as a second absorption area 122. The capacitance C1' is formed by the second absorption area 122, the dielectric 123, and the area 41, and the capacitance C2' is formed by the second absorption area 122, the dielectric 124, and the area 31. According to the present invention, an AC voltage signal s1($t$) is coupled into the capacitor network from an AC voltage generator 129 via a conductive connection 126 using the capacitors C1 and C1', the capacitances of the capacitors C3 and C3' being a function of whether objects are located in the response region. On the output side, a sensor amplifier 130 is connected via a conductive connection 127 to the area 31 of the capacitors C2, C2'. A signal s2($t$) is coupled out of the capacitor network here.

Figure 2:
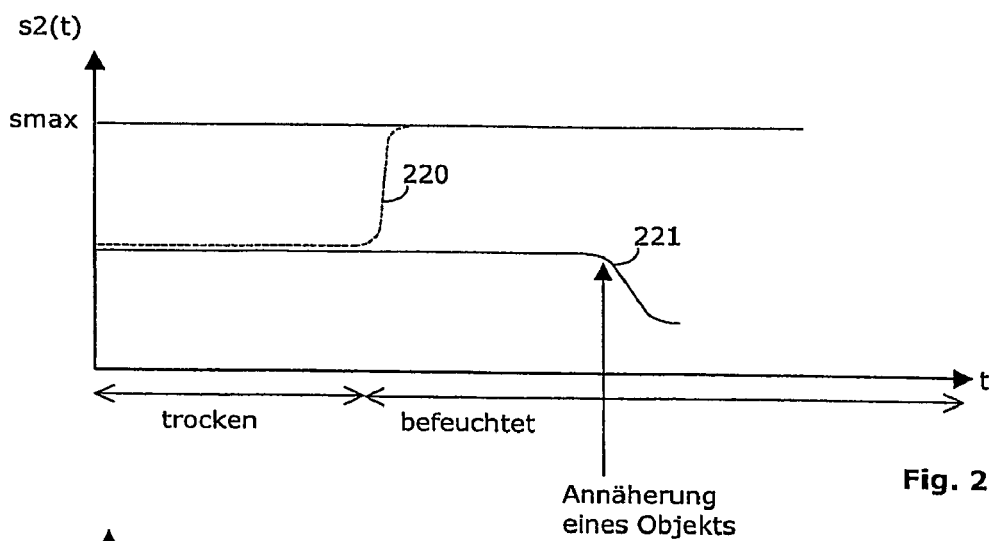
FIG. 2 shows a schematic illustration which displays the comparison of a conventional sensor and a sensor device according to the present invention under the effect of moisture.
Figure 7:
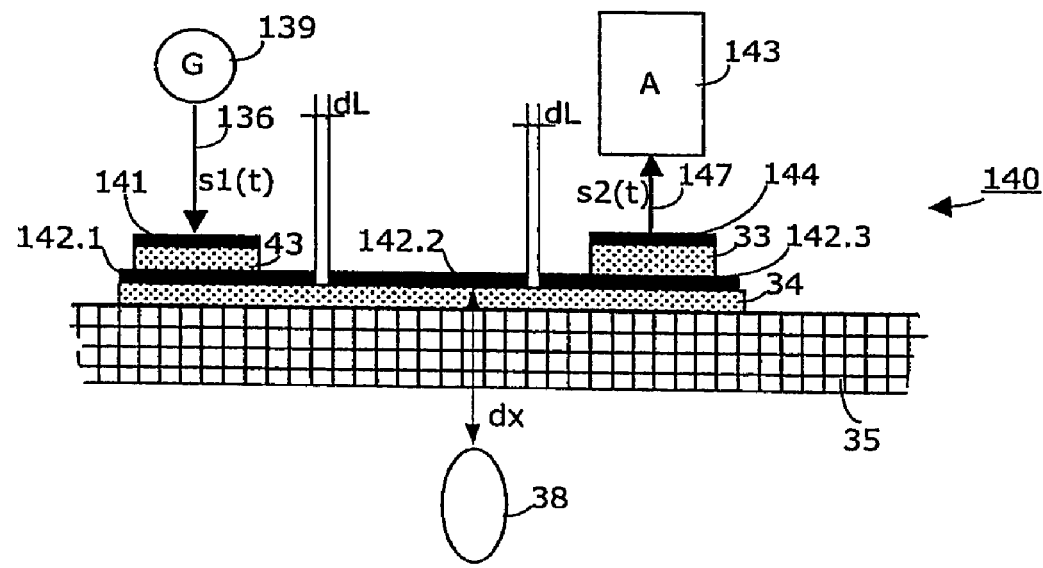
FIG. 7 shows a further sensor device according to the present invention in a sectional illustration.

A further embodiment 140 is shown in FIG. 7. The embodiment 140 shown in FIG. 7 corresponds in some elements to those of the construction 30. For the sake of simplicity, these elements are identified using the identical reference numbers as in FIG. 1A and FIG. 1B. The sensor device 140 is distinguished in that the absorption area 142 is divided into 2 through n electrically separated partial areas 142.1, 142.2, through 142.n. The spatial response sensitivity in dx may thus be elevated as a function of dL (spacing between the partial areas) and the number of partial areas 142.1, 142.2, through 142.n. However, the signal-to-noise ratio and the short-circuit behavior in the event of moisture as shown in FIG. 2 accordingly worsen. According to the present invention, an AC voltage signal s1($t$) from an AC voltage generator 139 is coupled via a conductive connection 136 into the area 141 of the capacitor C1. On the output side, a sensor amplifier 143 is connected via a conductive connection 147 to an area 144 of the capacitor C2. A signal s2($t$) is coupled out of the capacitor network here.

Various further embodiments may be assembled on the basis of the embodiments shown and described through modification and other combinations of the individual elements. It is to be noted here that the figures are schematic. The figures are not to scale.

In the description, reference was made several times to an object whose motion and/or position within the response region is detectable. The objects may be body parts—for example, the hand of a user—or artificial or natural objects or liquids.

In addition, the sensor devices allow, among other things, the recognition of the following states and/or changes:
an object comes into the response region,
an object leaves the response region,
an object moves in the response region,
an object changes its size in the response region,
an object remains in the response region,
an object changes its composition in the response region.

Advantages of the Sensor Device:

The sensor devices according to the present invention essentially correct the disadvantages of known arrangements, or reduce the disadvantages detectably. The present invention has significant advantages in relation to the already known devices.

The sensor device according to the present invention has a significantly larger response and active region, since the active region is largely determined by the dimension and shape of the electrically conductive absorption area.

According to the present invention, a sensor is no longer simply implemented by a two-plate capacitor, but rather at least one fixed and one variable (and/or externally influenceable) capacitor are used. The spatial response region may be intentionally tailored to external conditions through the geometric shaping of the plates and through a corresponding positioning of the plates to one another. In this case, the response region may be predefined both in area and spatially.

The signal-to-noise ratio is improved multiple times by the direct coupling of the AC voltage s1($t$) into the absorption area 32 via C1.

The sensor unit according to the present invention recognizes static objects and moving and/or moved objects and their position within the active region, since a corresponding signal is generated using s2($t$).

Using the sensor unit according to the present invention, a much larger active region may be achieved in area using small generator voltages, e.g., between 2 volts and 5 volts (preferably 3 Vss).

The sensor unit according to the present invention is not influenced by non-grounded objects, since due to the constructive arrangement of C1 and C2, their field lines may not be influenced directly. Thus, for example, moisture and/or water largely has no influence, since it only comes into contact with the electrically conductive area 32.

In the event of a rapid ambient humidity change (in the extreme case from air to water), in typical two-plate devices their dielectric may become conductive (short-circuit), or at least change very strongly. In a device according to the present invention, the dielectric may only be influenced insignificantly in such a situation, since the moisture or the water only influences the absorption area. Because of the relatively low generator voltage, the devices according to the present invention are suitable for battery operation.

A further advantage is also that due to the defining size of the absorption area, the response region of the sensor device is largely independent of the dielectric of the carrier material. Therefore, a device according to the present invention may be used on greatly varying carrier materials.

As is obvious from the following embodiments, the sensor unit according to the present invention may be modified. All embodiments described up to this point may be modified as follows.

Figure 8:
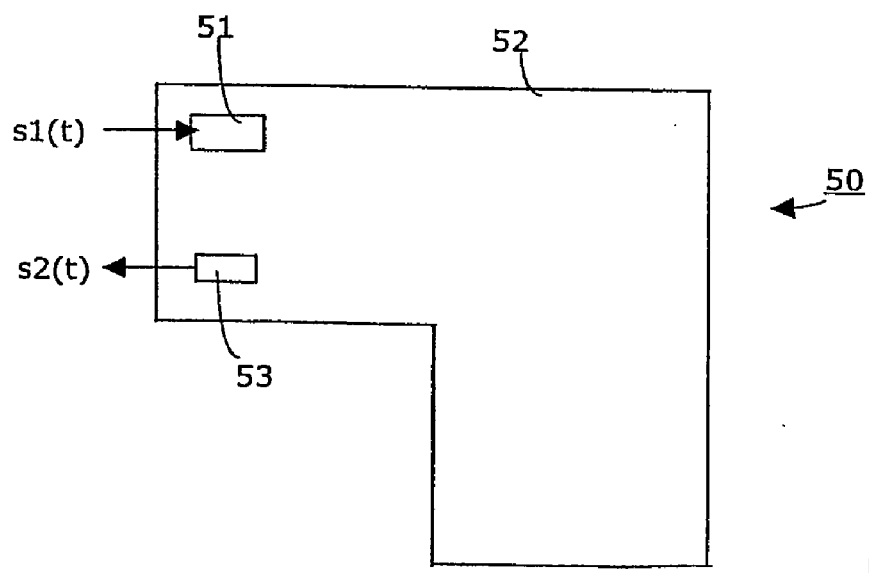
FIG. 8 shows a further sensor device according to the present invention in a top view.

A further embodiment 50 of the present invention is shown in FIG. 8 in a top view. The sensor device 50 shown has an L-shaped, conductive absorption area 52. Two capacitors C1 and C2 are seated on this absorption area 52. The capacitor C1 is formed by a part of the absorption area 52 and by an area 51. A dielectric, which is not shown in FIG. 8, is located below the area 51. The capacitor C2 is formed by another part of the absorption area 52 and by area 53. A dielectric, which is not shown in FIG. 8, is also located below the area 53. A response region may be predefined by the size and shape of the absorption area 52. The absorption area 52 may assume nearly any shape. It may be situated two-dimensionally or even three-dimensionally. The sensor device 50 may again have a signal $s1(t)$ applied to it by a generator. An output signal $s2(t)$ may be coupled out from the area 53 at the capacitor C2. The function is comparable to the embodiments described previously. As soon as an object approaches the absorption area 52, for example, this approach may be detected. The position of C1 and C2 in relation to the absorption area 52 may be determined specifically for the application. Care must only be taken that a minimum spacing is ensured between C1 and C2, so that the direct coupling to one another is negligible.

Figure 9:
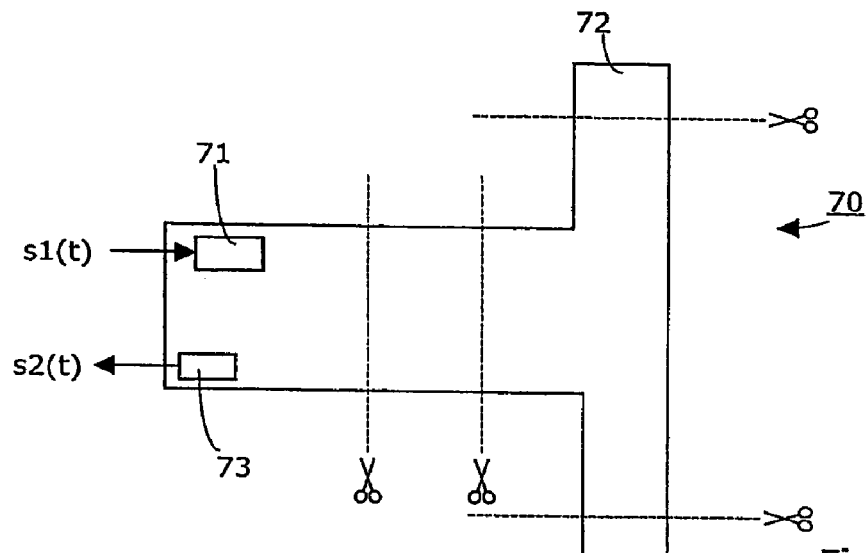
FIG. 9 shows a further sensor device according to the present invention in a top view.

A further embodiment 70 of the present invention is shown in FIG. 9 in a top view. The sensor device 70 shown has a T-shaped, conductive absorption area 72. Two capacitors C1 and C2 are seated on this absorption area 72. The capacitor C1 is formed by a part of the absorption area 72 and by a plate 71. A dielectric, which is not shown in FIG. 9, is located below the plate 71. The capacitor C2 is formed by another part of the absorption area 72 and by an area 73. A dielectric, which is not shown in FIG. 9, is also located below the area 73. In the embodiment shown, the response region may be fixed through removal (for example, by cutting off using scissors). An absorption area made of a conductive, flexible material is especially suitable. The absorption area 72 may, for example, be implemented as a film or metal sheet which is cut to size on a carrier material (such as a wall of a space or a (ceramic) wall of a sanitary device) before the sensor device 70 is attached. In order to make attaching the absorption area 72 easier, the absorption area 72 may be provided on one side with an adhesive film. With a suitable selection of the adhesive film, it may be used simultaneously as a dielectric of the capacitor C3. It is an advantage of the sensor device according to the present invention shown in FIG. 9 that while being detached and/or cut to size, no changes must be performed on the AC voltage generator and the input sensitivity. The position of C1 and C2 in relation to the absorption area 72 may be determined for the specific application. Care must only be taken that C1 has a minimum spacing to C2, so that the direct coupling to one another is negligible.

Figure 10:
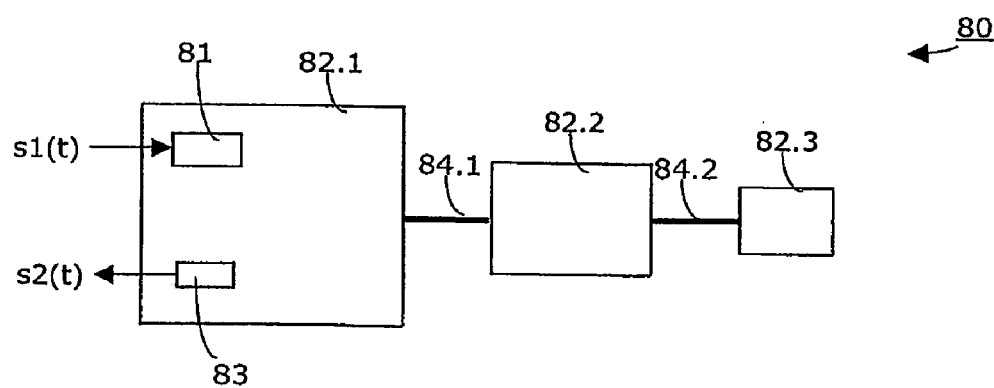
FIG. 10 shows a further sensor device according to the present invention in a top view.

A further embodiment of the present invention is shown in FIG. 10 in a top view. The sensor device 80 shown has three rectangular, conductive absorption areas 82.1, 82.2, 82.3. The absorption areas 82.1, 82.2, 82.3 are electrically connected to one another via connections 84.1 and 84.2. Two capacitors C1 and C2 are seated on the absorption area 82.1. The capacitor C1 is formed by a part of the absorption area 82.1 and by an area 81. A dielectric, which is not shown in FIG. 10, is located below the area 81. The capacitor C2 is formed by another part of the absorption area 82.1 and by an area 83. A dielectric, which is not shown in FIG. 10, is also located below the area 83. In the embodiment shown, the response region may be distributed onto the partial areas 82.1, 82.2, and 82.3. If these partial areas 82.1, 82.2, and 82.3 are selected in different sizes, it may be differentiated using an appropriate analysis device, with object distance dx remaining the same, whether an object has approached the first, the second, or the third partial area. This is made possible because, due to their different sizes, each of the partial areas also assumes a different effective capacitance when an object is moved toward it. If one assumes, for example, that a hand approaches the first partial area 82.1, a first damping of the signal $s2(t)$ results. In contrast, if the hand approaches the second partial area 82.2, the damping of the signal $s2(t)$ is less. These differences are recognizable by a suitable analysis device. However, these differences are not uniquely recognizable under certain circumstances, since, for example, a small object in front of the first partial area 82.1 may cause a similar damping as a somewhat larger object in front of the third partial area 82.3.

The embodiment shown in FIG. 10 may be modified, for example, by providing the capacitor C2, which is used for coupling out, on an area other than the partial area 82.1.

Possible Manufacturing Methods:

All embodiments may be manufactured using the following method.

The sensor devices according to the present invention may be manufactured in greatly varying ways. Preferably, a dielectric material, such as epoxy, glass fibers, or plastic films, is used as an insulation layer (e.g., layers 33 and 43 in FIG. 1A). The conductive absorption layer may be applied to this insulation layer. There are various methods for this purpose. Gluing a film on, vapor-depositing or sputtering on a metal coating, and application using electroplating are especially suitable. A circuit board having metal coating (for example, having a copper lamination) may also be processed through etching in such a way that the absorption area receives the desired shape and size. The capacitors C1 and C2 may be applied to the back of the sensor device in further steps. These capacitors may either be prefinished components which are applied or they may be built up from individual layers.

Figure 11:
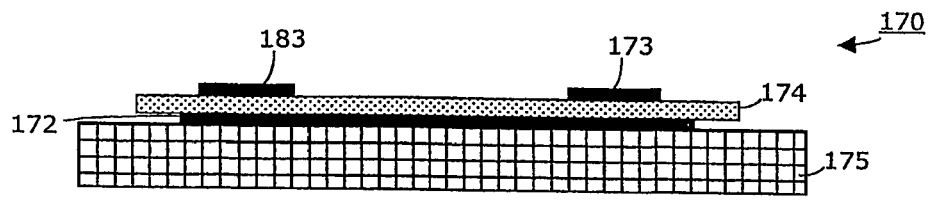
FIG. 11 shows a further sensor device according to the present invention in a sectional illustration.

Circuit boards 174 which are laminated on both sides with copper are also suitable. A sensor device 170 as shown in FIG. 11 may be manufactured therefrom. The first copper lamination is processed through etching, for example, in such a way that an absorption area 172 having the desired shape and size results. The second copper lamination, which is located on the other side of the circuit board 174, is textured by etching in order to form an area 173 of the capacitor C2 and an area 183 of the capacitor C1. The circuit board 174 is used as the dielectric layer of the two capacitors C1 and C2. This device may, for example, be attached directly to a carrier layer 175. This carrier layer may be a ceramic layer, for example. The mode of operation of the device 170 is comparable, for example, to the device 30. The entire electronics system (generator, signal preparation and analysis, microprocessor) may possibly also be integrated onto the same circuit board 174.

Figure 12:
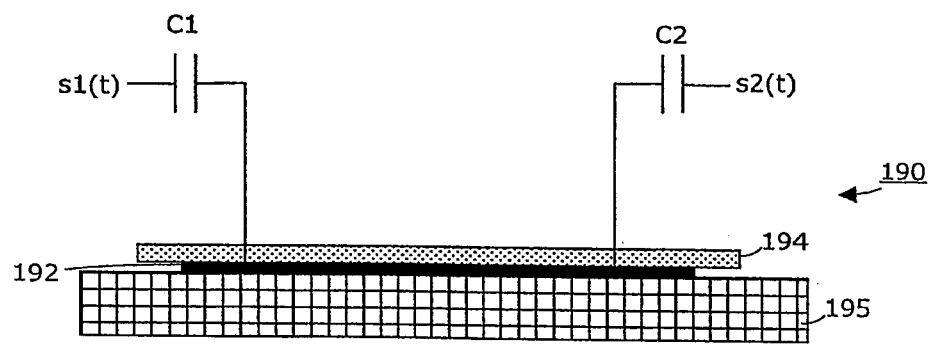
FIG. 12 shows a further sensor device according to the present invention in a sectional illustration.

An example of the sensor device 190, which was implemented on a board 194 laminated on one side, is shown in FIG. 12. The lamination is processed through etching, for example, in such a way that an absorption area 192 having the desired shape and size results. Two conventional capacitors C1 and C2 are used, which are connected to the absorption area 192 via an electrical connection. The input signal s1($t$) is applied to the input side of the capacitor C1 and the output signal s2($t$) may be coupled out on the output side at the capacitor C2. The mode of operation of the device 190 is comparable, for example, to the device 30. It is also to be noted that conventional capacitors may only be used conditionally, since, depending on the application, they are not commercially available in the required capacitance range. The capacitors preferably have a capacitance which is <1 pF.

An absorption area made of a conductive, flexible material is especially suitable. The absorption area may, for example, be implemented as a film or metal sheet which is cut to size on a carrier material (such as a wall of a space or wall of a sanitary device) before the sensor device is attached. In order to make attaching the absorption area easier, the absorption area may be provided with an adhesive film on one side. If the adhesive film is selected suitably, it may be used simultaneously as the dielectric of the capacitor C3.

Figure 13:
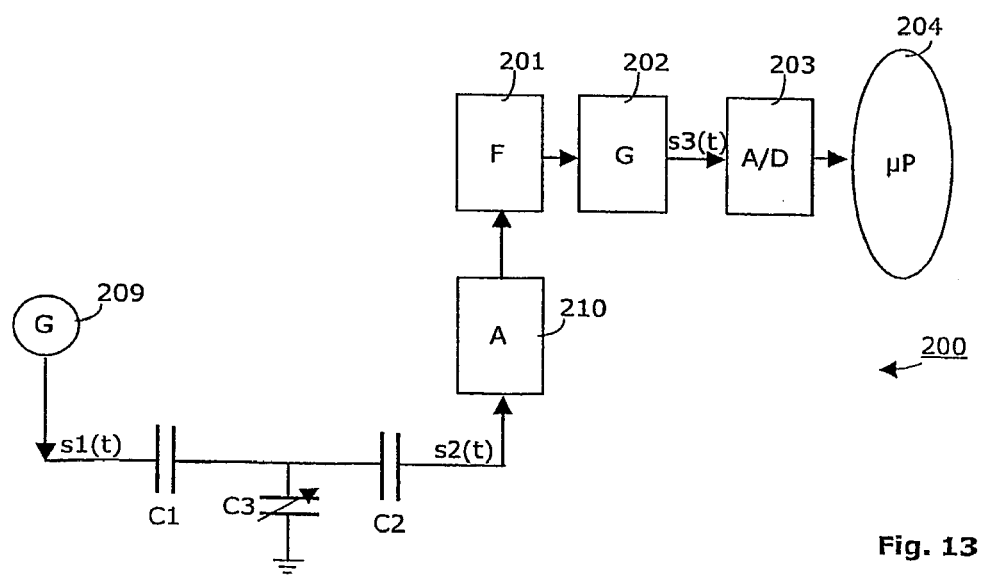
FIG. 13 shows a simplified block diagram of a further sensor device according to the present invention.

Exemplary Forms of Analysis:

One possible form of analysis may be inferred from FIG. 13. The block diagram of a sensor device 200 is shown. Originating from an AC voltage generator 209, the signal s1($t$) is coupled into the network. On the output side, a chain having the following elements is provided: sensor amplifier 210, filter 201 (preferably a bandpass filter which is tailored to the frequency of the signal s1($t$)), AC/DC converter 202 (rectifier), analog/digital converter 203, and microprocessor 204. The elements of the embodiment may be characterized in greater detail as follows: frequency of the signal s1($t$) approximately 20 kHz; amplitude of the signal s1($t$) approximately 5 V; application factor of the sensor amplifier 210 approximately 300; resolution of the analog/digital converter 203 10 bit and sample rate 10 Hz; clock frequency of the microprocessor 204 approximately 4 MHz and instruction time 1 $\mu$s. These are exemplary specifications.

Figure 14:
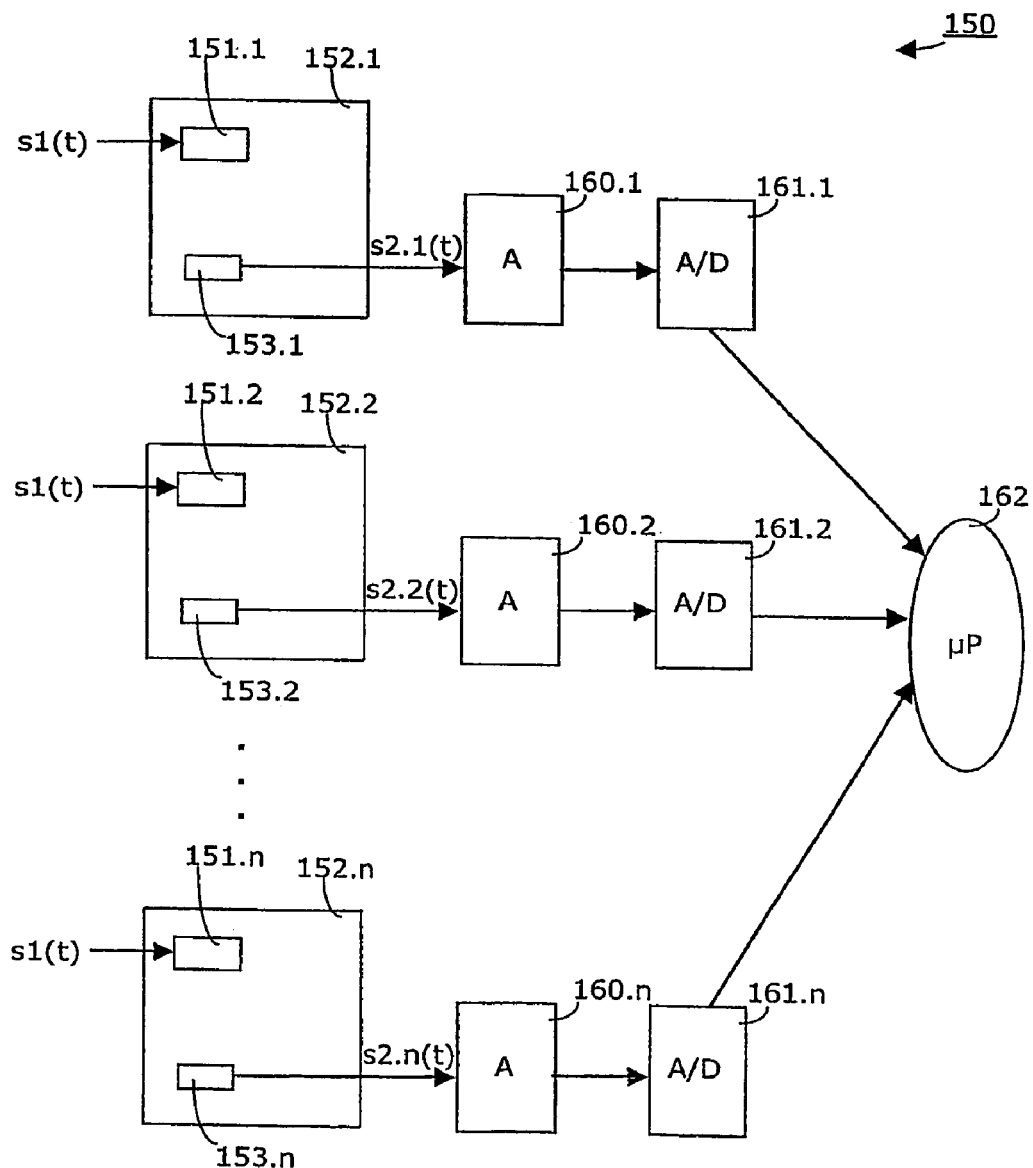
FIG. 14 shows a further sensor device according to the present invention in a top view.

A further possible form of analysis of a sensor device 150 according to the present invention is shown in FIG. 14. This is a device 150 which comprises n individual absorption partial areas 152.1 through 152.$n$. Each of these absorption partial areas 152.1 through 152.$n$ has the same input signal s1($t$) applied to it in the embodiment shown. It is also conceivable that each absorption partial area 152.1 through 152.$n$ has its own input signal applied to it. The input signal s1($t$) is coupled into the capacitor network via the capacitor C1.1—comprising the area 151.1, a dielectric, and the absorption partial area 152.1. The capacitors C1.2 through C1.$n$ each comprise the areas 151.2, 152.2 through 151.$n$, and a dielectric in each case. The partial signals s2.1($t$), s2.2($t$) through s2.$n$($t$) are coupled out via the capacitors C3.1, C3.2, through C3.$n$. The capacitor C3.1 is formed by the area 153.1, a dielectric, and the absorption partial area 152.1. C3.2 is formed by the area 152.2, the dielectric, and the absorption partial area 152.2. C3.$n$ is formed by the area 153.$n$, a dielectric, and the absorption partial area 152.$n$. The output signals s2.1($t$), s2.2($t$) through s2.$n$($t$) are supplied to sensor amplifiers 160.1, 160.2, through 160.$n$. After these output signals have been amplified, the amplified signals are converted using A/D converters 161.1, 161.2, through 162.$n$ into digital signals. In the example shown, a microprocessor 162 is used.

Using suitable analysis routines, the microprocessor 162 may analyze whether an object is located in front of one of the absorption partial areas 152.1 through 152.$n$. It may also determine in front of which of the absorption partial areas 152.1 through 152.$n$ the object is located. Depending on the arrangement of the absorption partial areas 152.1 through 152.$n$, not only a planar resolution, but rather also a spatial resolution may be achieved. In the example described, n is a natural number greater than 1. Motions and motion directions may also be recognized.

An operational amplifier is preferably used as the sensor amplifier in connection with the present invention. Ideally, the operational amplifier allows the amplification factor to be adjusted. Therefore, the sensor amplifier may be set in such a way that downstream stages (such as a coupling circuit for coupling the analog part of the sensor device with a downstream digital processing device) may be fed with a signal that lies in a range which may be processed. The regulation and/or the automatic adjustment may also be implemented in another way. The type of wiring cited may be used together with any of the previously described embodiments.

If a digital processing device (microprocessor or computer) is to be used in order to process the output signals of the capacitor sensor device, an A/D converter is used which is preferably connected downstream from the sensor amplifier or the AC/DC converter. The A/D converter converts the analog output signal at the output of the sensor amplifier or a rectified signal into digitally coded signals. The A/D converter is to have a resolution of 8, 10, 12, or more bits. The resolution has an influence on the precision of the A/D conversion. Depending on the embodiment, the A/D converter may have a parallel or a serial interface, via which a connection to the digital processing device (e.g., in the form of a microprocessor) is implemented, or it is already integrated into the processing device.

Fields of Application:

The main field of application of the present invention is currently seen in installations which are applied in the sanitary field in the widest sense, including the laboratory field, measurement technology in the widest sense, including level and position measurement, and in building technology in general. In connection with the present invention, the term installation comprises at least one sensor according to the present invention and/or one sensor device according to the present invention, a chain having processing elements, an energy source (power supply unit or battery), and a downstream system to convert the detection into an action (such as opening and closing an actuator (e.g., a valve or overflow protector), displaying information, or turning devices, valves, and the like on or off).

In the sanitary field, there is a need for detecting motions and positions without contact, for reasons of hygiene or operating comfort. Thus, for example, flushing a toilet bowl or a urinal bowl or turning on and off a water supply to a washbasin or sink, a shower stall, or a bathtub may be regulated or controlled without contact. Using suitable embodiments of the present invention, the supply of both cold water and hot water may be regulated separately, so that a mixture is received at a desired temperature.

Water supply regulators and/or controls to sanitary valves in the public area are frequently subjected to vandalism by the user, and it is an advantageous property of the present invention that water supply regulators and/or controllers may be designed as vandal-safe using it. The present invention is also suitable for sanitary valves which are predominately used by older people or the handicapped, since no application of force is necessary. In addition, with a suitable embodiment of the present invention, the region which a body part must approach may be implemented as relatively large, which allows actuation of sanitary valves by the handicapped.

In certain cases, it may be advantageous to provide an overflow safety on sanitary valves. Using an overflow safety of this type, overfilling and/or overflowing of a sanitary valve may be prevented more reliably than using an overflow opening, which may be clogged by contamination.

Figure 15:
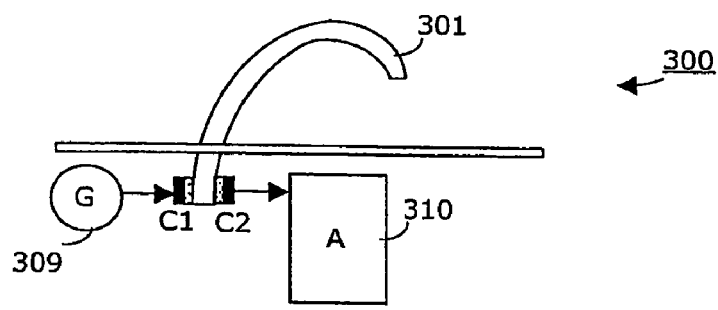
FIG. 15 shows a water tap according to the present invention having a sensor device in a side view.

In the sanitary field, there is a need to be able to activate and deactivate water supply valves without contact. Using the sensor device 300 according to the present invention, the supply unit 301 (water tap) may be used directly as the absorption area, as is schematically shown in FIG. 15. The AC voltage signal is provided by generator 309 and coupled into the tap 301 via a capacitor C1. An output signal is coupled out via a capacitor C2 and transferred to an amplifier 310. If a hand is brought into proximity to the tap 301 (absorption area), the water supply is turned on. If the hand is removed again, the water supply is interrupted again. Thanks to the sensor device according to the present invention, having the elements C1, C2, the generator 309, and the amplifier 310, in contrast to the known capacitor sensor devices, the hands are already recognized from a relatively large distance. The presence and the removal of the hands may also be recognized perfectly using the sensor device according to the present invention, in contrast to the known capacitor sensor devices.

The embodiment shown in FIG. 15 may be improved further by also applying the AC voltage signal of the generator 309 to the medium (in the present case water) which flows out of the tap 301. The stream of water emitted thus has the generator signal applied to it and may be "blanked out" in the analysis. The stream of water does not produce damping, but rather may produce a slight signal amplification depending on the coupling of the generator signal. Better differentiation between water and, for example, a hand is therefore possible. The AC voltage signal of the generator 309 may be applied to a metal part which is in contact with the water emitted via a high-ohmic resistor and a capacitor, for example.

Figure 16:
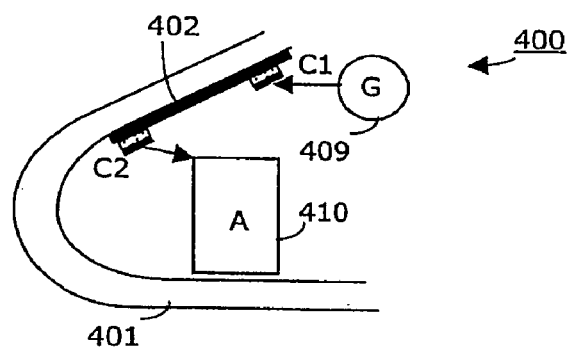
FIG. 16 shows a urinal according to the present invention having a sensor device in a detail view.

The sensor device 400 according to the present invention may also be used to control a urinal, as is indicated in FIG. 16. In this case, an absorption area 402 is attached behind a ceramic wall 401 of a urinal in such a way that the presence of the user and/or the urine stream is recognized as the object. The AC voltage signal is provided by a generator 409 and coupled into the absorption area 402 via a capacitor C1. An output signal is coupled out via a capacitor C2 and transferred to an amplifier 410. If a hand is brought into proximity to the water tap 301 (absorption area), the water supply is turned on.

In building technology, using the present invention, even larger areas, such as walls and the like, may be laid out in such a way that objects and, under some circumstances, also their position in front of these areas are detectable. New possibilities thus result for intelligent solutions in buildings in particular. For example, interactive areas may be implemented using the present invention.

In an intelligent building equipped in this way, sensor devices according to the present invention may be used to control elevators, for example.

A further field of application of the present invention is in the door automation field. Through suitable positioning of the sensor device, the automatic opening and closing of doors may be caused. Furthermore, the hazard region of the door may also be monitored, which prevents the door from closing when a person is located in the hazard region.

Figure 17:
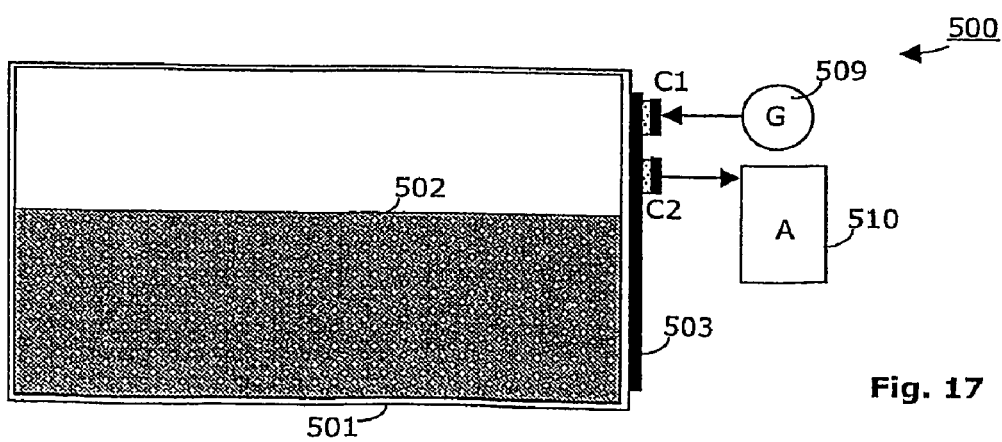
FIG. 17 shows an installation according to the present invention having a sensor device for determining the fill level.

A further field of application is in measurement technology. Using the present invention, a level measurement may be performed easily and without coming into contact with the medium 502, as is schematically shown in FIG. 17. By attaching a vertical absorption strip 503 to the outside of a non-conductive container 501, the corresponding level may thus be determined easily, since the absorption increases as a function of the absorption area 503 covered by the medium 502. In the embodiment 500, the AC voltage signal is provided by a generator 509 and coupled into the absorption area 503 via a capacitor C1. An output signal is coupled out via a capacitor C2 and transferred to an amplifier 510.

A system for leak recognition may also be implemented. For this purpose, the device according to the present invention is positioned in the region of a container to be monitored. Liquid or another medium escaping damps the field and may thus be detected. If a slight or low voltage generator signal is applied to the medium, as described in connection with FIG. 15, the system may differentiate liquid which has escaped from the container from other liquids.

A field of application which may also be included in measurement technology is position measurement. Since the present invention may also determine distances up to several tens of centimeters, a position measurement of an object or in relation to an object may be implemented.

A broad field for situating the sensor device according to the present invention is the kitchen field, for which combined sensor devices, such as those shown in FIG. 14, are particularly suitable. Various kitchen devices may thus be turned on and/or off or switch positions may even be changed. If the novel sensor device is used in the kitchen field, its contactless actuation is especially advantageous; working in the kitchen frequently results in dirty hands and sometimes requires sudden actuation of a device; if such an actuation must be performed via contact, the device is subsequently dirtied, which may be avoided through controls having the sensor device according to the present invention.

Call systems may also be controlled with the aid of sensor devices according to the present invention. With arrangements as shown in FIG. 10, it is additionally possible to selectively operate a call system.

A field of application which may also be included in building technology is the security field. The sensor devices according to the present invention may be used in a similar way as heat sensors, but are completely unremarkable, so that an unauthorized person is prevented from bypassing them or even shutting them down. For example, dangerous regions, such as machines or the like, may be secured by a sensor device. The sensor device may cause the machine to be turned off.

It is also possible to implement person monitoring using a foot mat, which has a capacitor plate or film as the foot mat. If a person steps onto this mat, the generator signal is damped.

As it is desirable for reasons of hygiene to actuate the control of the water supply to sanitary valves without contact, it may be advantageous in the medical field, particularly in operating rooms, to control greatly varying devices of medical technology without contact.

In the widest sense, irrigation systems, possibly with fertilizer supplies, of nurseries or agrotechnical experimental fields, for example, even in greenhouses, may also be included in the sanitary field. Advantageous arrangements may be implemented for this purpose, particularly having a sensor device as shown in FIG. 10. The regions which trigger a reaction of the sensor device when approached are positioned inside a map representation of the ground to be irrigated, the partial areas 82.1, 82.2, and 82.3 of the sensor device lying in partial regions of the map illustration. The control of an irrigation system is therefore very visible and simple.

I claim:

1. A water supply for sanitary devices, which is equipped with a sensor device (30) and is activatable without contact, comprising:
   (a) a first capacitor (C1) having a first and second electrically conductive layer (32 and 41) and having a dielectric layer (43) positioned there-between;
   (b) a second capacitor (C2) having a first and second electrically conductive layer (32 and 31) and having a dielectric layer (33) positioned there-between;
   (c) an AC voltage generator (G), which is electrically connected to the second layer (41) of the first capacitor (C1), for coupling in an AC voltage signal (s1($t$)); and
   (d) a sensor amplifier (A) for amplifying an output signal (s2($t$)); and
   wherein the first layer (32) is shared by the two capacitors (C1 and C2) and comprises a shared electrically conductive absorption area (32.2) or is electrically or capacitively connected to said shared absorption area (32.2), which, upon approach or contact of an object (38) or a liquid, forms an additional capacitor (C3) whose effective capacitance experiences a detectable change that is tapped at the second layer (31) of the second capacitor (C2) in the form of a correspondingly changed output signal (s2($t$)).

2. The water supply according to claim 1 further comprising a water supply tap (301) or metallic parts of said water supply tap, forming as the absorption area (32.2) which is electrically or capacitively connected to the first layer (32).

3. The water supply according to claim 1 wherein the AC voltage signal (s1($t$)) of the generator (G) is also applied to a medium flowing out of a tap (301).

4. The water supply according to claim 1 in combination with a sanitary device selected from the group consisting of: a toilet; a urinal; a washbasin; a sink; a shower; and a bathtub.

5. The water supply according to claim 1 wherein the first layer (32) comprises a shared electrically conductive absorption area (32.2) and is positioned as a film behind a wall of a sanitary device.

6. The water supply according to claim 5 wherein the wall of the sanitary device is a ceramic wall (401) of a urinal.

7. An installation (500), equipped with a sensor device (30), for level measurement in or on liquid containers (501), comprising:(a)
   (a) a first capacitor (C1) having a first and second electrically conductive layer (32 and 41) and having a dielectric layer (43) positioned between them;
   (b) a second capacitor (C2) having a first and second electrically conductive layer (32 and 31) and having a dielectric layer (33) positioned there-between;
   (c) an AC voltage generator (G), which is electrically connected to the second layer (41) of the first capacitor (C1), for coupling in an AC voltage signal (s1($t$)); and
   (d) a sensor amplifier (A) for amplifying an output signal (s2($t$)); and
   wherein the first layer (32) is shared by the two capacitors (C1 and C2) and comprises a shared absorption area (503), an additional capacitor (C3) being formed upon filling of the container (501) with a medium (502), whose effective capacitance experiences a detectable change corresponding to the fill level, which is tapped at the second layer (31) of the second capacitor (C2).

8. An installation (500) for level measurement in liquid containers (501) according to claim 7 wherein a vertical absorption strip (503) is attached to an outside of a non-conductive water container (501) of a sanitary device, the sanitary device comprising at least one of a toilet and a urinal.

9. An installation (500) for level measurement in liquid containers (501) according to claim 7 in combination with and for leak detection in a region of a container to be monitored.

10. An installation according to claim 9 including means for generating a low voltage signal and wherein the medium stored in the container has the low voltage generator signal applied thereto.

11. A facility (50) for recognizing persons, having a sensor device (30), comprising:
   (a) a first capacitor (C1) having a first and second electrically conductive layer (32 and 41) and having a dielectric layer (43) positioned there-between;
   (b) a second capacitor (C2) having a first and second electrically conductive layer (32 and 31) and having a dielectric layer (33) positioned there-between;
   (c) an AC voltage generator (G), which is electrically connected to the second layer (41) of the first capacitor (C1), for coupling in an AC voltage signal (s1($t$)); and
   (d) a sensor amplifier (A) for amplifying an output signal (s2($t$)); and
   wherein the first layer (32) is shared by the two capacitors (C1 and C2) and comprises a shared absorption area (52), an additional capacitor (C3) being formed upon the approach or contact of a person to the absorption area (52), whose effective capacitance experiences a detectable change that is tapped at the second layer (31) of the second capacitor (C2).

12. The facility (50) for recognizing people according to claim 11 wherein the first layer (32) having the shared absorption area (52) is incorporated into a floor, wall, or ceiling covering or positioned thereon.

13. The facility (50) for recognizing people according to claim 12, wherein the shape and size of the first layer (32) having the shared absorption area (52) are tailored to the conditions.

14. The facility (50) for recognizing people according to claim 11 wherein the recognition of a person opens or closes a door.

* * * * *

UNITED STATES PATENT AND TRADEMARK OFFICE
CERTIFICATE OF CORRECTION

PATENT NO. : 7,015,704 B1
APPLICATION NO. : 10/523089
DATED : March 21, 2006
INVENTOR(S) : Edo Lang et al.

It is certified that error appears in the above-identified patent and that said Letters Patent is hereby corrected as shown below:

<u>Title page, Item [54] and Column 1, line 1,</u>
Title, should read -- CAPACITIVE SENSOR DEVICE AND INSTALLATIONS COMPRISING A SENSOR DEVICE OF THIS TYPE --.

<u>Title page,</u>
Item [76], should read:
-- [76] Inventor: Edo Lang, Churweg 5, CH-7203 Trimmis (CH); Roland Obrist, CH-7412 Scharans (CH) --.

Signed and Sealed this

Twentieth Day of June, 2006

JON W. DUDAS
*Director of the United States Patent and Trademark Office*